United States Patent
Suzuki

(10) Patent No.: US 6,509,571 B2
(45) Date of Patent: *Jan. 21, 2003

(54) PROXIMITY EXPOSURE METHOD BY OBLIQUE IRRADIATION WITH LIGHT

(75) Inventor: Shinji Suzuki, Kawasaki (JP)

(73) Assignee: Ushiodenki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/413,341

(22) Filed: Oct. 12, 1999

(65) Prior Publication Data

US 2002/0030165 A1 Mar. 14, 2002

(30) Foreign Application Priority Data

Oct. 12, 1998 (JP) ............................. 10-289041

(51) Int. Cl.$^7$ ................................. G21G 5/00
(52) U.S. Cl. ................... 250/492.2; 250/492.1
(58) Field of Search .................... 250/492.2, 491.1; 355/53, 67; 430/36

(56) References Cited

U.S. PATENT DOCUMENTS 5,827,629 A * 10/1998 Miyatake ............... 430/30
5,999,245 A * 12/1999 Suzuki .................. 355/53
6,046,793 A * 4/2000 Tanaka et al. ........... 355/67

FOREIGN PATENT DOCUMENTS

JP 56-114326 9/1981

* cited by examiner

Primary Examiner—Jack Berman
Assistant Examiner—Kalimah Fernandez
(74) Attorney, Agent, or Firm—Nixon Peabody LLP; David S. Safran

(57) ABSTRACT

A proximity exposure method in which a mask pattern can be projected onto a predetermined area of a workpiece even if the light is allowed to be incident obliquely on the mask is achieved in a proximity exposure device in which a mask and a workpiece are arranged with a predetermined gap between them and the workpiece is irradiated obliquely with light via the mask, based on the gap size G between the mask and the workpiece, on the angle of incidence δ of the irradiation light with respect to the mask and based on the angle of irradiation Φ with which the irradiation light is incident with respect to the X-direction of the mask pattern, the displacement position of the mask pattern to be projected is computed, and according to the result of this computation, the workpiece is moved and the light is emitted. In this way, the mask pattern can be projected onto the predetermined position of the workpiece and the desired area can be irradiated with light.

3 Claims, 4 Drawing Sheets

PROXIMITY EXPOSURE METHOD BY OBLIQUE IRRADIATION WITH LIGHT

BACKGROUND OF THE INVENTION

1. Field of the Invention

The invention relates to a method of proximity exposure by oblique irradiation of a workpiece with UV radiation. The invention relates especially to a proximity exposure method which is suited for optical alignment of an alignment layer of a LCD element.

2. Description of Related Art

To determine the size of the pre-tilt angle and the direction of alignment of a liquid crystal of an LCD element, a device was proposed in which an alignment layer, as the workpiece, is obliquely irradiated with UV radiation; see, for example, paragraphs (0011) and (0086) of published Japanese Patent Application HEI 9-197409 (also UK application GB 2310934 B1, and German application 19654638).

The angle of incidence and the irradiation angle of the light incident on the workpiece are different depending on the type of alignment layer and other treatment conditions.

In the alignment of the alignment layer of an LCD element, a pixel is divided into two or more pixels and the alignment direction of the liquid crystals is changed for the respective pixel which is formed by the division, by which the angle of view field of the liquid crystal display is improved. This method is called the pixel division method or multi-domain method.

In the case of using the optical alignment for this pixel division method, part of the pixel formed by division is irradiated with UV light using a mask. Next, the mask is changed or is turned horizontally relative to the workpiece. The other part of the pixel which is formed by division is irradiated from a direction which differs from the first irradiation direction, proceeding from the workpiece. Under certain circumstances, the irradiation angle is changed. By repeating this process as frequently as the number of divisions, the alignment direction of the liquid crystals can be changed for the respective pixel which is formed by division. In this case, only the desired parts may be exactly irradiated with UV radiation via the mask. For this purpose, the mask pattern must be positioned relative to the desired UV radiation and relative to the area of the workpiece to be irradiated, and irradiation is performed with parallel light.

FIG. 7 schematically shows LCD elements. As the drawings show, there are a host of LCD elements on the substrate, each group being formed from three pixels P1, P2 and P3 which correspond to R(red), G (green) and B (blue) respectively. Pixels P1, P2 and P3 each have a length of roughly 150 microns and a width from roughly 50 to 100 microns. Between each of the pixels, there is a zone which is called the "black matrix" and which does not transmit light. In the case of a liquid crystal display of the TFT (thin film transistor) drive type, the respective pixel P1 to P3 is partially provided with a drive TFT element.

In a pixel division method as shown in FIG. 7, each pixel is divided into several pixels. In the respective zone which is formed by division, the direction of the alignment of the liquid crystals (in the drawing, the arrow directions in pixel P2) is changed. On the boundary line of the respective zone which is formed by the division, light is transmitted by scattering of the direction of alignment, and irregularities form in the images. To prevent this, there is a black matrix with a width of from 10 to 20 microns. When the width of this black matrix becomes larger, the degree of opening of the pixel becomes smaller, by which it becomes darker. The narrower the black matrix, the better. The width currently desired is 5 microns. In FIG. 7, only the pixel P2 is divided. However, in fact, all of the pixels P1 to P3 are divided in the same way as in P2.

Light irradiation for optical alignment is conventionally performed as follows:

Here, a case is described in which a pixel is divided into four pixels, i.e., into first through fourth zones, and optical alignment is performed. In the pixel P2 as shown in FIG. 7, for example, the zone at the top right is called the first zone, the zone at bottom right is called the second zone, the zone at bottom left the third zone and the zone at top left the fourth zone.

(1) FIG. 8 schematically shows one example of a mask M which is used for optical alignment. As is shown in the drawings, in the mask M, at the sites which each correspond to the first zone of the pixel formed by division, there are openings OP (in the drawings, the area surrounded by the broken line corresponds to a pixel). Furthermore, on the mask M, alignment marks MAM for positioning are recorded.

Using the mask M which is shown in the drawing, the first zones of the workpiece are irradiated with light via the mask M with a predetermined angle of incidence with reference to the mask and a preset irradiation angle with respect to the X-direction of the mask pattern.

(2) Next, the workpiece is turned, for example, by 180° and the third zones which are arranged point-symmetrically around the pixel center are irradiated with light with a predetermined angle of incidence and a preset irradiation angle.

(3) Then, the mask is replaced with another mask which has openings which correspond to the second zones and which differ from the first zones. The third zones are irradiated with light with a predetermined angle of incidence and a preset irradiation angle.

(4) The workpiece is turned by 180°. The fourth zones which are arranged point-symmetrically around the pixel center relative to the second zones are irradiated with light with a predetermined angle of incidence and a preset irradiation angle.

When, in optical alignment of the respective zones of the pixel, the adjacent zones are irradiated with this light, scattering of the alignment and thus irregularities of the images occur. Therefore, it is necessary for the deviation in the positioning of the mask relative to the workpiece to be smaller than the value of the width of the black matrix located around the pixel (for example, preferably 5 microns, as described above).

For LCD elements, large substrates having dimensions of 550×650 mm to 650×830 are becoming more and more frequent and important. To treat large substrates with a high throughput in this way, therefore proximity exposure is used as the exposure process in which a mask and a workpiece are brought into proximity with one another until a predetermined spacing is reached (the mask and the workpiece do not come into contact with one another), and in which the entire substrate is irradiated overall with parallel light.

In the case of a conventional proximity exposure device, a horizontally arranged workpiece is irradiated vertically with light. Here, the optical axis of the irradiated light (parallel light) and the mask are arranged perpendicular to one another.

The mask and the workpiece are positioned as follows:

Using an alignment microscope in which the optical axis of the alignment light is located parallel to the optical axis of the irradiation light, the alignment marks recorded on the mask and the alignment marks recorded on the workpiece are determined and the mask or the workpiece is moved such that they come to rest on one another. The mask is positioned relative to the workpiece with respect to the vertical direction. After completion of positioning, the workpiece is irradiated via the mask with light. The irradiation light, as parallel light, is incident vertically on the mask. The mask pattern is projected into a stipulated area of the workpiece and shields the covered area. The UV radiation is emitted only onto a desired area.

When, in a proximity exposure device, an attempt is made to irradiate the alignment layer workpiece obliquely with UV radiation, in order to determine the size of the pre-tilt angle and the direction of alignment of the liquid crystals, as described above, the light must be allowed to be incident obliquely on the mask.

When the mask is irradiated obliquely with light, however, on the workpiece, a position deviation of the mask pattern which has been projected by the irradiation light is formed because, in proximity exposure, there is a gap between the mask and the workpiece.

In a conventional proximity exposure method, the positioning of the mask relative to the workpiece with respect to the vertical direction is performed. When the mask is irradiated obliquely with light, the location at which the mask pattern is projected onto the workpiece deviates. The irradiation light is thus emitted outside the desired area.

SUMMARY OF THE INVENTION

The invention was devised to eliminate the above described defect in the prior art. Therefore, a primary object of the present invention is to devise a proximity exposure method in which the mask pattern can be projected onto a stipulated area of the workpiece so that only a desired area of the workpiece is irradiated with light, even if the light is allowed to be incident obliquely on the mask.

The object is achieved in accordance with the invention as follows:

(1) In a proximity exposure method, in which a mask on which a mask pattern is formed has a predetermined spacing relative to a workpiece, and in which the workpiece is irradiated obliquely with light via the mask so that the mask pattern is exposed onto the workpiece, positioning of the workpiece relative to the mask is performed based on the angle of incidence and the irradiation angle of the light with respect to the mask, and based on the above described spacing, and the mask pattern is exposed onto only a desired area of the workpiece.

(2) In a proximity exposure method in which a mask on which a mask pattern is formed has a predetermined spacing relative to a workpiece, and in which the workpiece is irradiated obliquely with light via the mask and the mask pattern is exposed onto the workpiece, the amount of deviation between the projection site of the mask pattern on the workpiece in vertical irradiation of the mask with light and the projection site of the mask pattern on the workpiece with oblique irradiation of the mask with light is computed based on the angle of incidence and the irradiation angle of the light with respect to the mask, and based on the size of the spacing between the mask and the workpiece, positioning of the workpiece to the mask is preformed based on this computed amount of deviation and the mask pattern is exposed onto the workpiece.

(3) In a proximity exposure method, using a proximity exposure device which comprises:

an alignment microscope for determining the mask alignment marks and the workpiece alignment marks;

a gap measuring device for measuring the gap between the mask and the workpiece;

a workpiece carrier movement device for moving a workpiece carrier in the X-Y-Z-Θ directions; and a light irradiation device for oblique light irradiation of the workpiece via the mask, the following steps are performed:

the workpiece is arranged relative to the mask with a predetermined gap therebetween;

using the gap measuring device, the size of the gap between the mask and the workpiece is measured;

viewing from a direction perpendicular to the mask, determining position coordinates (Xn, Yn) of the mask alignment marks and of the workpiece alignment marks by means of the alignment microscope;

by moving the workpiece carrier in the X-Y-Θ directions, the position coordinates (Xn, Yn) of the workpiece alignment marks are moved to the position coordinates (X, Y) which are designated with the formulas described below, when for any X-Y coordinates, the determined position coordinates of the workpiece alignment marks are (Xn, Yn) and the position coordinates of the workpiece alignment marks for positioning of the workpiece alignment marks relative to the mask alignment marks by the movement of the workpiece carrier in the X-Y-Θ) directions are (Xn+ΔX, Yn+ΔY);

the mask and the workpiece are positioned to one another; and the mask pattern is exposed onto the workpiece.

$$X = Xn + \Delta X - G \cdot \tan \delta \cdot \cos \Phi$$

$$Y = Yn + \Delta Y - G \cdot \tan \delta \cdot \sin \Phi$$

where G is the size of the gap between the mask and the workpiece, δ is the angle of incidence of the irradiation light into the mask and Φ is the irradiation angle of the irradiation light which is incident in the X-direction of the mask pattern.

As was described above, according to the invention, based on the angle of light incidence δ, the irradiation angle Φ and the size of the gap G, positioning of the mask relative to the workpiece is performed and the pattern is exposed onto the workpiece. In this way, the mask pattern can be projected onto a predetermined position of the workpiece and the desired area can be irradiated with light.

In the following, the invention is described specifically based on the embodiment shown in the drawing.

DETAILED DESCRIPTION OF THE INVENTION

Figure 1:
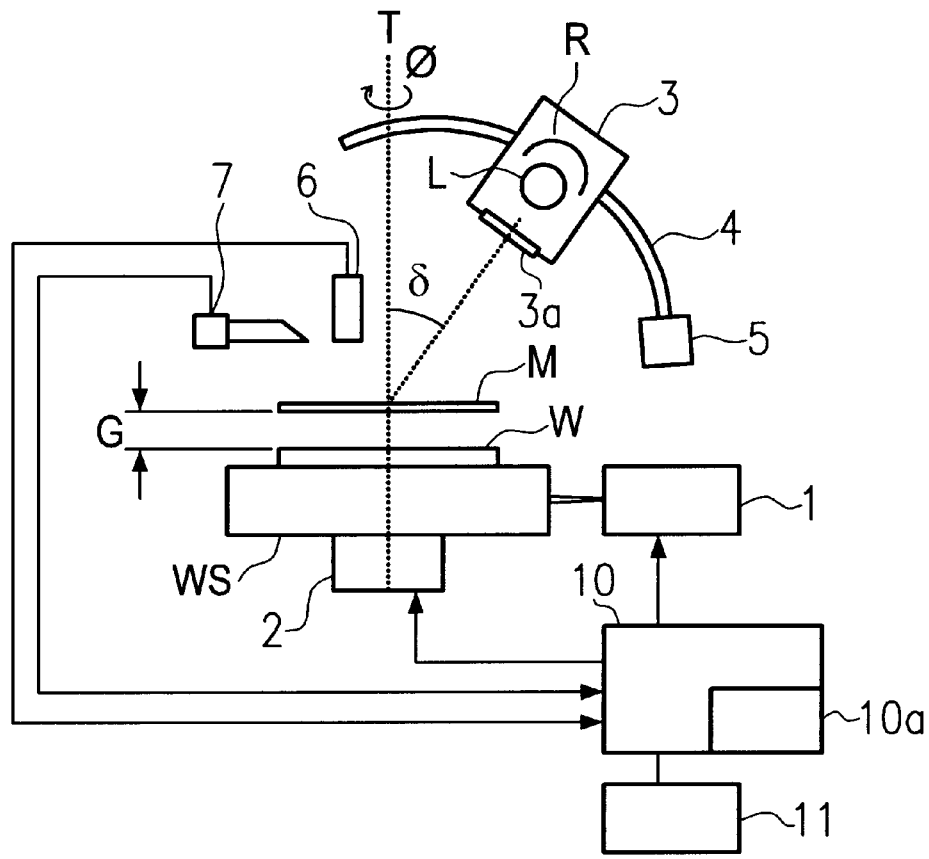
FIG. 1 is a schematic depiction of one embodiment of a proximity exposure device in accordance the present invention.

FIG. 1 schematically shows the arrangement of one embodiment of the proximity exposure device in accordance with the invention in which a workpiece W, for example, a liquid crystal display element substrate or the like, is placed on a workpiece carrier WS. Furthermore, a mask M is located spaced above the workpiece W with a predefined gap G between them (in the drawing, the size of the gap is shown exaggerated).

On the mask M and the workpiece W, mask alignment marks (hereinafter called "mask marks MAM") and workpiece alignment marks (hereinafter called "workpiece marks WAM") are recorded for positioning and are viewed using an alignment microscope 7 which is described below. In this way, positioning of the mask M relative to the workpiece W is performed.

The workpiece carrier WS is driven by means of an X-Y-Θ drive device 1 in the X-Y-Θ directions (for example, X: to the right and left in FIG. 1; Y: in and out of the plane of the drawing, Θ: in a direction of rotation around an axis perpendicular to the X-Y plane, i.e., an axis extending in a Z-direction, up and down in the drawings) and by means of a Z-drive device 2 is driven in the Z-direction (up and down in the drawings).

A lamp housing 3 in which a lamp L for emitting light which contains UV radiation, and an oval reflector R and the like are located. Parallel exposure light is emitted from an exit opening 3a of the lamp housing 3. The lamp housing 3 is furthermore supported by an arc-shaped guide 4, as is shown in the drawings.

The lamp housing 3 is arranged to be able to move along the guide 4. Therefore, the angle of incidence δ of the exposure light can be changed with respect to the mask M and the workpiece W by the lamp housing 3 being moved along the guide 4 by means of a lamp housing drive device 5.

The lamp housing 3, the guide 4 and the lamp housing drive device 5 are made such that they can be turned as a whole around an axis T. The irradiation direction of the exposure light can be changed with respect to the mask M and workpiece W by turning the lamp housing 3 around the axis T by means of the lamp housing drive device 5 (hereinafter the angle of rotation around the axis T is called the "irradiation angle Φ").

By moving the lamp housing 3 along the guide 4, the angle of incidence δ can be changed in the range 0<δ<90°. Furthermore, the irradiation angle Φ can be changed in the range from 0≦Φ≦360° by the lamp housing 3 being turned around the axis T.

For the above described lamp housing, the lamp housing already proposed by in published Japanese patent application HEI-10-154658 can be used.

Above the mask M, there are a gap measuring device 6 for measuring the gap size G between the mask M and the workpiece W and an alignment microscope 7 for positioning of the mask M relative to the workpiece W. The measuring device already proposed in published Japanese patent application HEI 10-268525 (EP 0 867 775 A2) can be used as the gap measuring device.

Furthermore, a control element 10 controls driving of the X-Y-Θ drive device 1 and the Z-drive device 2 based on the outputs of the gap measuring device 6 and the alignment microscope 7 and moves the workpiece carrier WS in the X-Y-Θ-Z directions. The control element 10 has a storage part 10a which stores an adjustment value $G_o$ of the gap size G as the light irradiation gap between the mask M and the workpiece W and the adjustment values δo, Φo of the angle of the light which is incident on the workpiece W. These adjustment values which are input by an input part 11 are adjusted in the storage part 10a.

In the following, the process for positioning of the mask relative to the workpiece in accordance with the invention is described.

Figure 2:
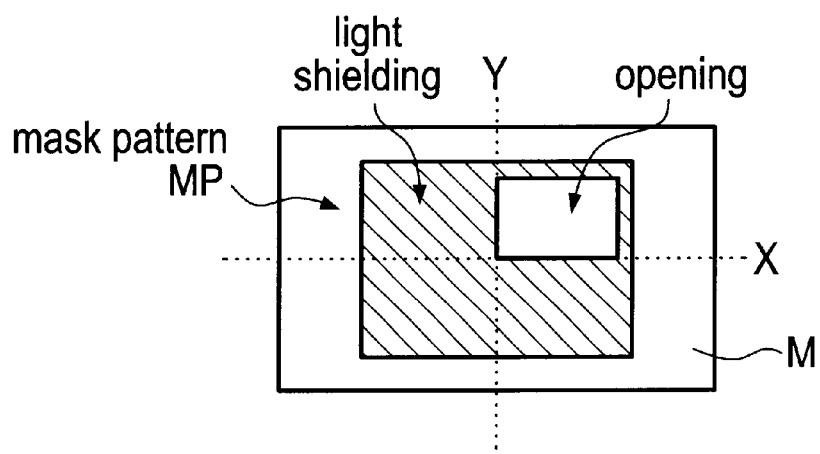
FIG. 2 schematically illustrates an example of a mask pattern formed on a mask.

Here, an example in described in which the mask pattern shown in FIG. 2 is formed on the mask M (a mask pattern which corresponds to a pixel), the mask M is attached and the workpiece is moved. Using the mask M, the mask M and the workpiece W are arranged with a predefined gap G between them, as is illustrated in FIG. 3, and using the alignment microscope 7, the coordinates of the mask marks MAM and of the workpiece marks WAM are determined.

Figure 3:
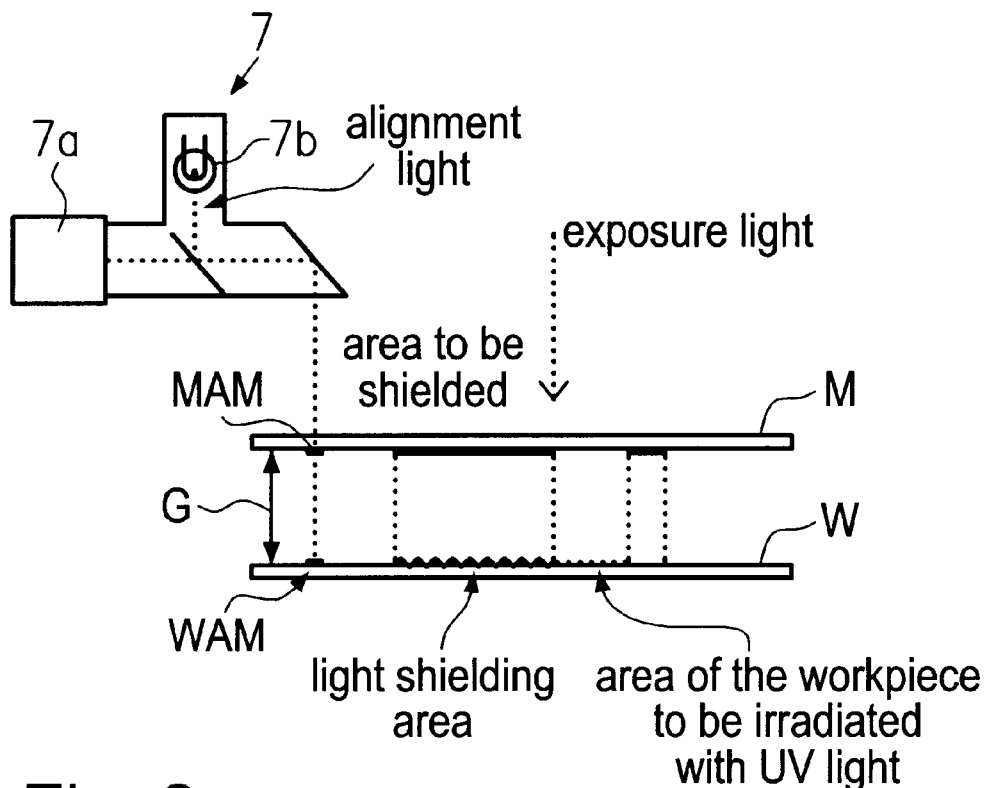
FIG. 3 shows an example in which a mask and a workpiece are positioned in the vertical direction to one above the other.

In FIG. 3, the alignment microscope 7 has a CCD camera 7a and a light source 7b for emitting alignment light. The alignment light emitted from the light source 7b is emitted onto the mask marks MAM and the workpiece marks WAM. By means of the CCD camera 7a of the alignment microscope 7, the mask marks MAM and the workpiece marks WAM are recorded. The recorded video signals are sent to the above described control element 10.

Figure 4:
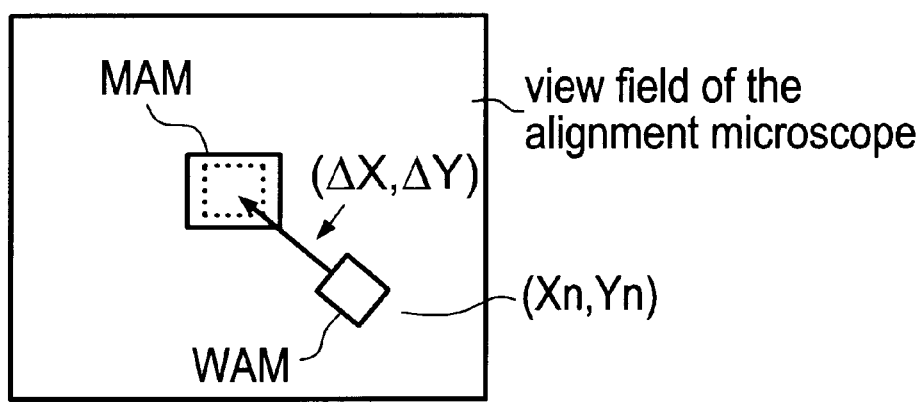
FIG. 4 is a schematic representation of the determining of the location coordinates of a mask mark and a workpiece mark using an alignment microscope.

Before positioning, in the alignment microscope 7, the mask mark MAM and the workpiece mark WAM are viewed, as is shown in FIG. 4.

The mask M and the workpiece W can be positioned in the vertical direction when the workpiece is moved in the X-Y-Θ directions such that the mask mark MAM and the workpiece mark WAM are aligned with one another (such that the workpiece mark WAM is located at the site shown in the mask mark MAM in FIG. 4 using the broken line). FIG. 3 shows this state.

Specifically, the correlation is determined between the amount of movement of the workpiece carrier WS and the amount of movement in the video processing coordinates of the workpiece mark WAM which corresponds to the movement of the workpiece carrier WS, beforehand. The positional information about the alignment marks obtained by the alignment microscope 7 according to FIG. 3 is subjected to video processing in the control element 10 and the position coordinates for the video processing coordinates of the respective alignment mark are computed.

The above described processing makes it possible to compute the amount of displacement (ΔX, ΔY, ΔΘ) in the X-Y-Θ directions with which the workpiece mark WAM which is originally located at coordinates (Xn, Yn) moves to the coordinates in which it is aligned with the mask mark MAM.

Figure 5:
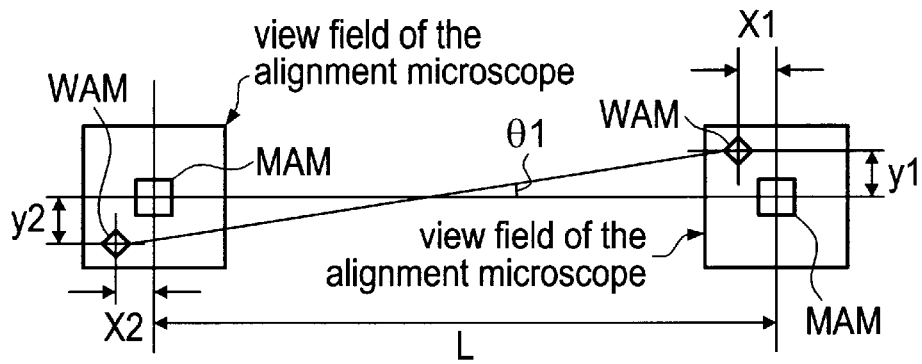
FIG. 5 is a schematic representation of positioning of the mask relative to the workpiece.

The amount of displacement in the X-Y-Θ directions (ΔX, ΔY, ΔΘ) is computed as the amount of movement of the workpiece carrier WS in the X-Y directions and as the amount of rotation Θ of the workpiece carrier WS in which the positions of the two mask marks MAM shown in FIG. 5 and the workpiece marks WAM are aligned with one another.

When based on the above described computation, the workpiece carrier WS moves and positioning of the mask M relative to the workpiece W is performed in the vertical direction, the workpiece mark WAM has position coordinates of (Xn+ΔX, Yn+ΔY).

Figure 6A:
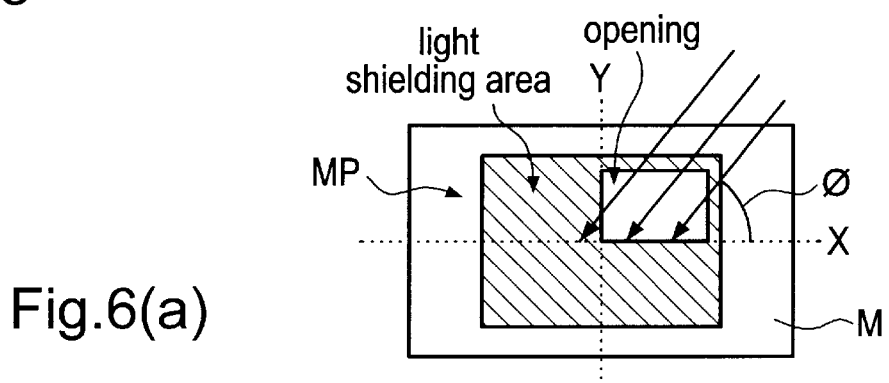
FIGS. 6(a) through 6(c) each schematically depict positioning when light is obliquely incident on the mask and the workpiece.
Figure 6B:
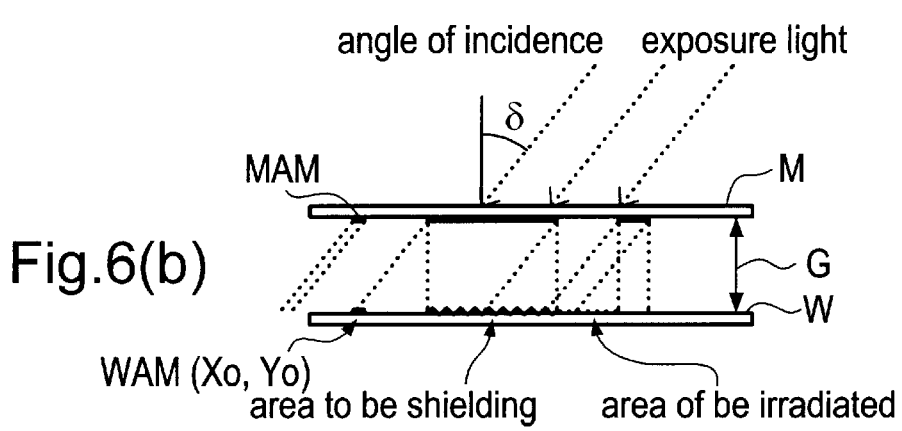

In the case of oblique light irradiation of the mask M, the position at which the mask pattern is projected on the workpiece W is shifted, depending on the "angle (angle of incidence) δ with which the irradiation light is incident in the mask M," the "angle (irradiation angle) with which the irradiation light is incident with respect to the X-direction of the mask pattern" and "the size of the gap G between the mask M and the workpiece W" because the irradiation light is parallel light as is shown in FIGS. 6(a) and 6(b).

Within the mask pattern surface, the X-Y coordinate axes are defined. The angle of the light incident with respect to the X-axis is called the irradiation angle Θ. The direction of the X-Y coordinate axes of the mask pattern and the direction of the X-Y coordinate axes of the workpiece carrier are brought into alignment with one another. In this way, the movement of the workpiece carrier is regulated.

Figure 6C:
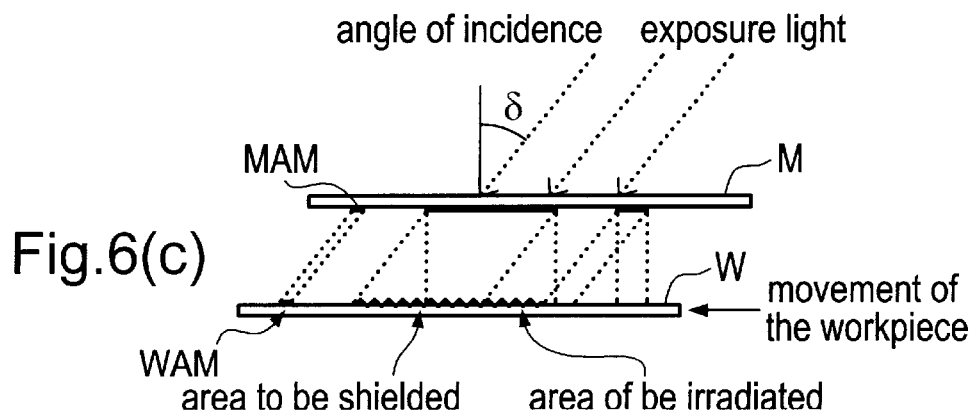
Figure 7:
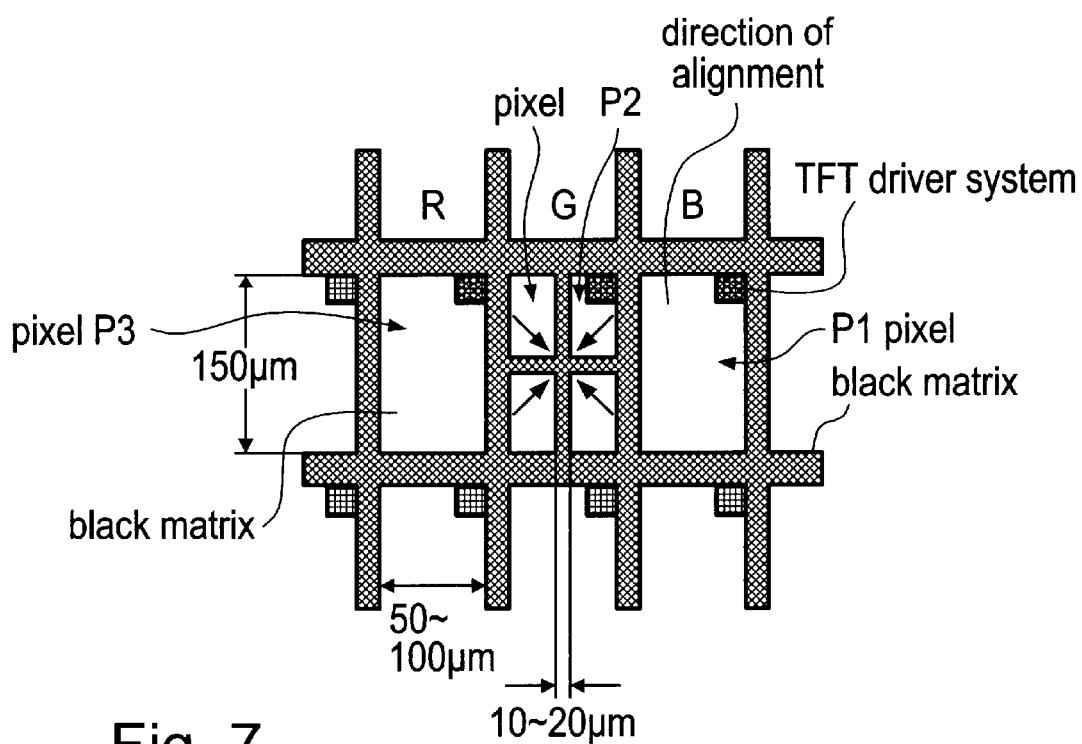
FIG. 7 shows a schematic representation of an LCD element.
Figure 8:
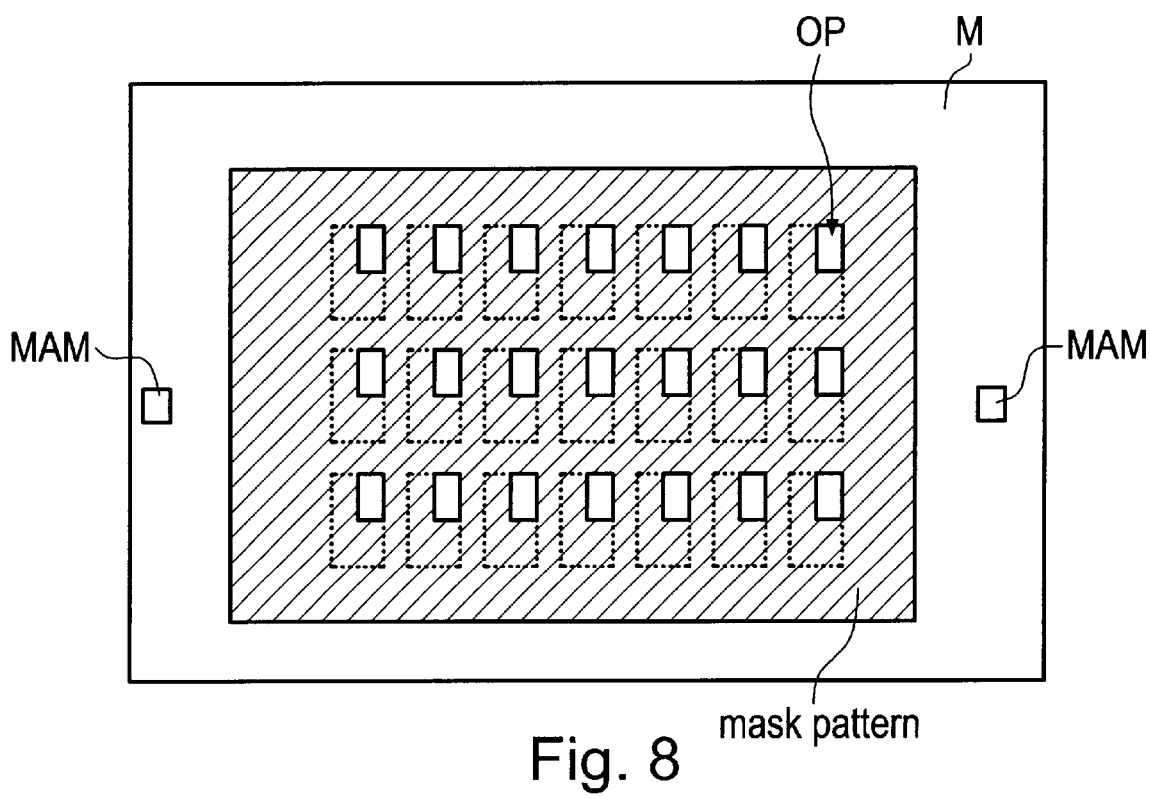
FIG. 8 shows an example of a mask M which is used for optical alignment.

Therefore, by moving the workpiece W by the amount of displacement described above, the mask pattern can be projected onto a predetermined area and a desired area can be irradiated with light, as is shown in FIG. 6(c).

The above described amount of displacement is computed as follows:

With reference to the positions (X, Y) to which the mask pattern is shifted as shown in FIG. 6(b), these positions are described with the following formulas where $(X_o, Y_o)$ are the position coordinates at which any mask pattern MAM is projected onto the workpiece W when light is incident vertically on the mask M, G is the size of the gap between the mask M and the workpiece W, δ is the angle of incidence of the irradiation light with respect to the mask, and Φ is the irradiation angle with which the irradiation light is incident with respect to the X-direction of the mask pattern:

$$X = X_o - G \cdot \tan \delta \cdot \cos \Phi$$

$$Y = Y_o - G \cdot \tan \delta \cdot \sin \Phi$$

Here, it can be imagined that the coordinates $(X_o, Y_o)$ are the position coordinates of the workpiece mark when the mask M is positioned relative to the workpiece W in the vertical direction. Therefore, the following applies:

$$(X_o, Y_o) = (Xn + \Delta X, Yn + \Delta Y)$$

Therefore, for oblique light irradiation, only a desired area can be irradiated with light when the workpiece carrier is subjected to movement control in the X-Y-Θ directions such that the workpiece mark WAM is moved from the coordinates (Xn, Yn) to the coordinates (X, Y).

In the following, the processes of positioning and exposure using the above described process are described using the exposure device which is shown above in FIG. 1.

(1) The adjustment value $G_o$ of the size of the light irradiation gap between the mask M and the workpiece W, the adjustment value δo of the angle of incidence with respect to the workpiece W and the adjustment value Φo of the irradiation angle are input by the input part 11. These values are all stored in the storage part 10a of the control element 10.

(2) The control element 10, based on the input information about the angle of incidence δo and the irradiation angle Φo, drives the lamp housing drive device 5 and moves the lamp housing 3 which emits the light.

(3) The output of an encoder which is located in the device 5 is input into the control element 10. The control element 10 determines the amount of movement of the lamp housing 3 and computes the actual angles δ, Φ of the light which is incident in the actual workpiece. These values are stored in the storage part 10a of the control element 10.

(4) On the other hand, the workpiece carrier Ws is lifted by the Z-drive device 2. The locations of the mask marks MAM and the workpiece marks WAM are determined by the alignment microscope 7 at the alignment gap position. The determined signals are subjected to video processing. Based on this information, in the control element 10, the position coordinates of the workpiece carrier WS (Xn+ΔX, Yn+ΔY)=$(X_o, Y_o)$ are determined in which positioning of the mask relative to the workpiece in the X-Y-Θ directions is to be produced in the vertical direction.

(5) Then, the workpiece carrier WS is lifted according to the adjustment gap size $G_o$ as far as the position of the adjustment gap size G.

After movement, the gap measuring device 6 measures the gap size G between mask M and the workpiece W at several locations. These values are returned to the control element 10. The position of the workpiece carrier WS in the Z-direction is moved back and forth by means of an adjustment device (not shown) for movement back and forth such that it is in a predetermined area with respect to the adjusted gap size $G_O$.

The substrate of the LCD element is large, as described above. The mask M used for this purpose is also large. In the mask M, sagging occurs due to its weight. Therefore, it is necessary to measure again whether the gap size G with respect to the adjustment value $G_o$ lies in an allowable range in order to regulate the sagging of the mask M when necessary.

(6) The actual gap size at the conclusion of adjustment is G. This gap size G is stored in the storage part 10a of the control element 10.

(7) Based on the actual values δ and Φ of the light angle and of the gap size G stored in the storage part 10a, i.e., the values stored in the storage part 10a, the control element 10 computes the position coordinates (X, Y) to which the workpiece carrier should move using the formulas described above.

Based on this computation result, the control element 10 moves the workpiece W by means of the X-Y-Θ drive device 1 such that the workpiece mark WAM is moved to coordinates (X, Y).

(8) After completion of the movement of the workpiece carrier WS, light is emitted from the lamp housing 3 and the mask pattern is exposed onto the workpiece W. In the case of a device in which the lamp housing 3 is manually moved, the movement position of the workpiece W is determined by the fact that the adjustment values δo and Φo of the angle of the light which is incident in the workpiece W is used unchanged.

(9) After completion of exposure of the first zones of the pixel on the substrate of the LCD element in the above described manner, the workpiece is turned, for example, by 180°, as was described above. The mask M and the workpiece W are positioned relative to one another in the above described manner. Then, the third zones which are located point-symmetrically with respect to the first zones around the pixel center are irradiated with light with a predetermined angle of incidence and a preset irradiation angle.

The mask M is replaced. The second and fourth zones of the pixel on the substrate of the LCD element are exposed in the above described manner.

Action of the Invention

As was described above, in accordance with the invention, in a proximity exposure device in which a mask and a workpiece are arranged with a predetermined gap between them and the workpiece is irradiated obliquely with light via the mask, based on the gap size G between the mask and the workpiece, on the angle of incidence δ of the irradiation light with respect to the mask and based on the irradiation angle Φ with which the irradiation light is incident with respect to the X-direction of the mask pattern, the displacement position of the mask pattern to be projected is computed, and according to the result of this computation, the workpiece is moved and the light is emitted. In this way, the mask pattern can be projected onto the predetermined position of the workpiece and the desired area can be irradiated with light.

I claim:

1. Proximity exposure method in which alignment of a workpiece and a mask and irradiation of the workpiece are performed with obliquely angled exposure light, comprising the following process steps:

positioning a workpiece in vertical alignment with a mask on which a mask pattern is formed with light directed toward the workpiece and mask vertically from above;

arranging the workpiece spaced from the mask with a gap of a predetermined size therebetween moving the workpiece out of said vertical alignment for aligning the workpiece relative to the mask based on an angle of incidence and an irradiation angle of the obliquely angled exposure light with respect to the mask and based on the size of said gap; and irradiating the workpiece with obliquely angled exposure light via the mask and exposing the mask pattern onto the workpiece.

2. Proximity exposure method as claimed in claim 1, wherein an amount of deviation between a projection site of the mask pattern on the workpiece in vertical irradiation of the mask with light and a projection site of the mask pattern on the workpiece with oblique irradiation of the mask with light is computed, and based on this computed amount of deviation the aligning is performed.

3. Proximity exposure method as claimed in claim 1, wherein said aligning comprises the following steps:

measuring the gap between the mask and the workpiece with a gap measuring device;

determining locations of mask alignment marks and workpiece alignment marks by an alignment microscope viewed from a position perpendicular to the mask;

moving the workpiece alignment marks by moving a workpiece carrier in X-Y-Θ directions, from first position coordinates to second position coordinates, the second position coordinates being (X, Y) determined by the formulas:

$$X = X_n + \Delta X - G \cdot \tan \delta \cdot \cos \Phi$$

$$Y = Y_n + \Delta Y - G \cdot \tan \delta \cdot \sin \Phi$$

where, for any X-Y coordinates, ($X_n$, $Y_n$) are the position coordinates of the determined locations of the workpiece alignment marks, ($X_n + \Delta X$, $Y_n + \Delta Y$) are the position coordinates of the workpiece alignment marks of the workpiece which has been re-positioned relative to the mask alignment marks by moving the workpiece carrier in the X-Y-Θ directions, G is the size of the gap between the mask and the workpiece, δ is angle of incidence of the obliquely angled light into the mask, and Φ is the irradiation angle of the irradiation light which is incident in the X-direction of the mask pattern.

* * * * *